March 14, 1950 T. G. ARNOLD, JR 2,500,505

AUTOMATIC GAIN CONTROL SYSTEM

Filed Feb. 8, 1945

INVENTOR
THOMAS G. ARNOLD, Jr.
BY George V. Eltgroth
AGENT

Patented Mar. 14, 1950 2,500,505

UNITED STATES PATENT OFFICE 2,500,505

AUTOMATIC GAIN CONTROL SYSTEM

Thomas G. Arnold, Jr., Baltimore, Md., assignor to Bendix Aviation Corporation, South Bend, Ind., a corporation of Delaware Application February 8, 1945, Serial No. 576,879

3 Claims. (Cl. 250—20)

Figure 1:
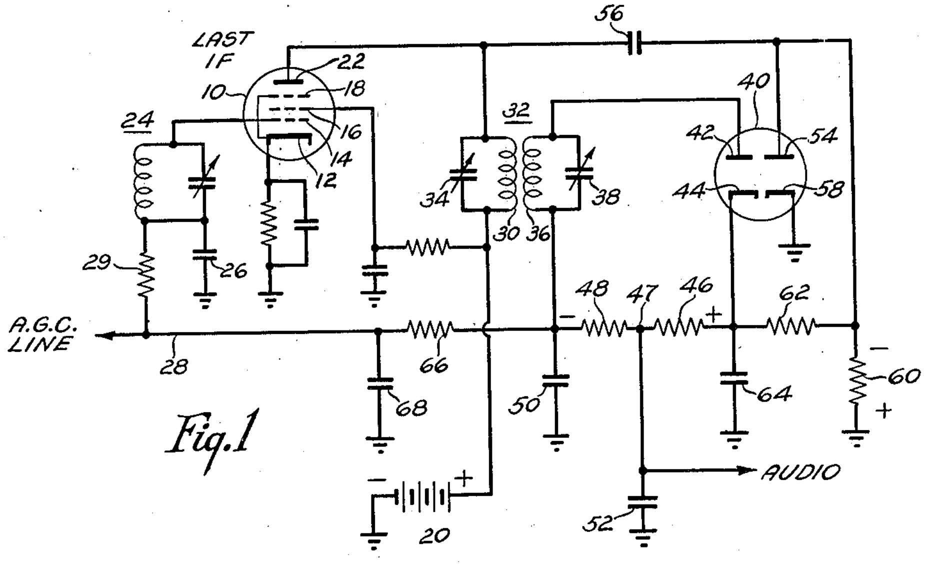

This invention relates to apparatus for deriving unidirectional potentials from alternating potentials and more particularly to such an apparatus especially adapted for use in conjunction with the automatic gain control circuits of signal responsive amplifiers, such as employed in radio receivers and the like.

In such devices more commonly employed at the present time, signal energy at the output of the channel whose gain is to be controlled is rectified in a simple diode circuit and the resulting voltage then filtered and impressed on the gain control circuits. In radio receivers it is common practice to employ two diodes for the rectification of signal energy, one of which delivers a replica of the modulation for use in succeeding audio amplifiers and the other of which performs the above mentioned function. There is no coaction between these two rectifiers, each being directed to and serving solely a single purpose, namely, that of demodulation or of carrier rectification.

The gain control provided for such circuits is, as is well known, inadequate for many applications and, to overcome this deficiency, recourse has been made to the use of D. C. amplifiers for increasing the gain control voltage available for a given change in signal level at the point of rectification. This, of course, involves the introduction of an additional tube and an increase in the total anode supply voltage required for operation. In receivers intended for operation directly from the limited anode supply voltage available from a 28 or 32 volt battery supply without intermediate voltage step-up devices, this recourse is not available, if the manufacturing cost of the equipment is to be kept with reasonable bounds. Further, in such receivers the maximum available voltage for rectification at the output of the final amplifier has a peak value substantially equal to the anode supply voltage, thus limiting the maximum control voltage available for channel gain control. When equipment is operated in the immediate vicinity of high powered radio transmitters this may mean that with the maximum gain control voltage available the input stage of the amplifier will yet be driven to the grid current region with resulting deterioration of performance.

Accordingly it is a primary object of the invention to provide new and novel signal rectifying apparatus for developing a unidirectional control voltage exceeding in magnitude the input signal level to such rectifying means.

Another object of the invention is to provide new and novel apparatus to derive a unidirectional control voltage from the output of a signal amplifier in which the rate of change of said control exceeds the rate of change of signal level.

Yet another object of the invention is to provide new and novel rectification apparatus for use in conjunction with automatic gain control circuits in which the rate of change of control potential with deviation from a preselected signal level is increased without inclusion of D. C. amplifying means.

Still another object of the invention is to utilize in combination the direct current output voltage of a demodulating diode and a carrier rectifying diode to improve the automatic gain control characteristics of radio receiving apparatus.

A further object of the invention is to provide new and novel means for improving the automatic gain control characteristic of receivers including a demodulation and an AVC rectifying diode by the additional insertion of a single resistor and capacitor.

Still a further object of the invention is to provide a new and novel automatic gain control rectifying circuit incorporating but two diodes and no auxiliary anode supply to deliver a control voltage changing at a greater rate than the deviations in the input voltage of said combination, in conjunction with means for preventing the transmission of control voltage variations without a predetermined range.

Figure 2:
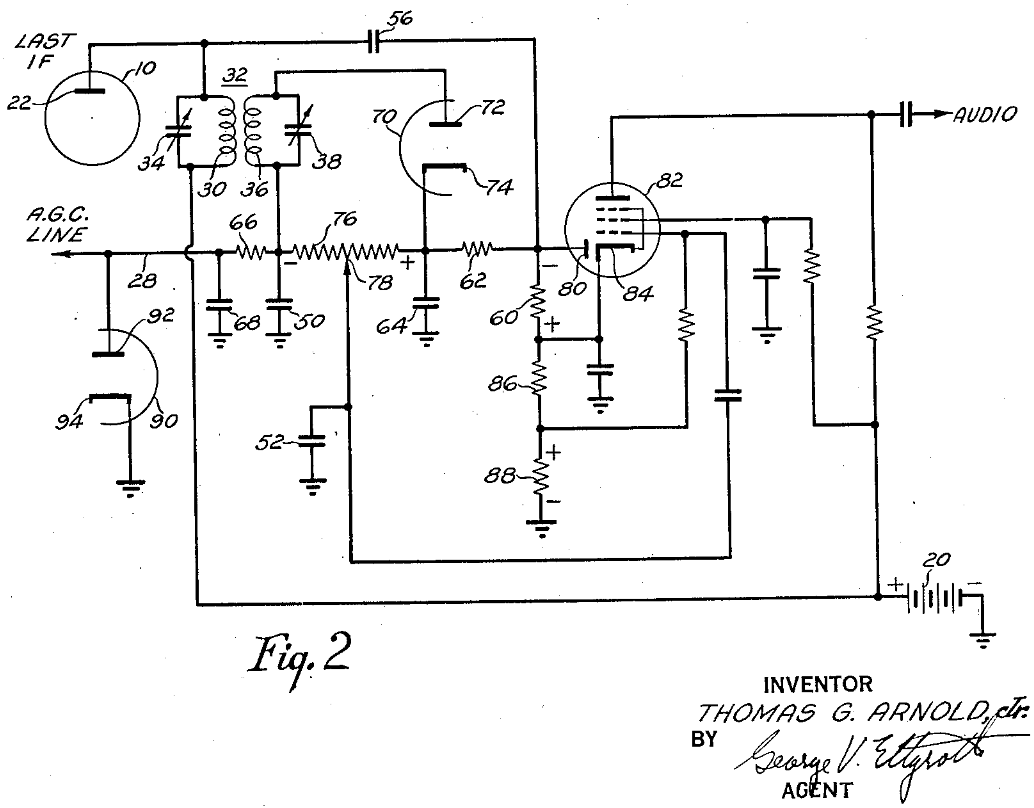

Other objects and advantages of the invention will in part be described and in part be obvious when the following specification is read in conjunction with the drawings in which:

Figure 1 is a schematic diagram of a simple gain control rectifier incorporating the invention but not having a delay characteristic and Figure 2 is a schematic diagram of a gain control rectifier circuit incorporating the invention with means for impressing the output potentials of a demodulator on a following modulation amplifier and with means for providing a delay characteristic in the output voltage delivered to the gain control line.

Generally speaking, the apparatus described herein attains the desired objects through the use of two diode rectifiers, one of which is connected to the alternating voltage source through a resistor and the other of which is connected to said source through a capacitor. The second diode is shunted by a resistor and the D. C. voltage component appearing across this resistor is impressed on an element of the first mentioned diode through a second resistor. The D. C.

voltages appearing across the load resistor and the shunt resistor are thereby combined in additive sense to produce a resulting voltage, available for control purposes, greater than the peak value of the input voltages from the source.

Referring now to the drawings, there is shown in Figure 1 a vacuum tube 10 which may occupy the position of final intermediate frequency amplifier in a conventional radio receiver. The amplifier 10 is provided with the conventional cathode 12, control grid 14, space charge grid 16, and suppressor grid 18, the latter being connected to the cathode 12. The amplifier 10 is energized from the direct current source 20 having its positive terminal connected to the output electrode 22 through the primary 30 of transformer 32. As shown, primary 30 is shunted by capacitor 34. The space charge grid 16 is excited from the source 20 through the usual dropping resistor, and the cathode 12 is returned to ground through the familiar bypassed cathode resistor. Signal voltages are impressed on the control grid 14 via the resonant circuit 24 which may be coupled to any of the conventional sources of signal energy, and is preferably tuned to such frequency, and has one terminal connected to said control grid 14 and the other terminal connected to ground for signal energy by capacitor 26, but connected to the automatic gain control line 28 by resistor 29 for direct current potentials, whereby voltages existing on the line 28 appear on control grid 14 and regulate the gain of the amplifier 10 in a manner well known.

The signal controlled amplifying action of amplifier 10 produces a signal output voltage across primary 30 and also, by virtue of its coupling to primary 30, across the secondary 36, which is also shunted by a capacitor 38.

Capacitors 34 and 38 may be so selected as to resonate their respective windings at the signal input frequency, though it is not essential to the operation of the device. The transformer 32, in combination with the amplifier 10, may now be regarded as a source whose output is regulable upon variation of the direct current potential applied to the control grid 14.

To derive the intelligence modulation from the input signal there is further provided the dual diode tube 40, whose anode 42 is connected to one terminal of the secondary winding 36, while the associated cathode 44 is connected to the other side of secondary winding 36 through resistors 46 and 48, which together comprise a tapped resistor across which the intelligence modulation appears. Capacitors 50 and 52 present negligible impedance at the carrier frequency but relatively high impedance at the modulation frequency and effectively serve as filter means in conjunction with the associated resistor 48 to eliminate carrier frequency energy from the modulation signal taken off at the tap 47 between resistors 46 and 48.

A second carrier rectifier means is also present and consists of the circuit wherein anode 54 of the tube 40 is connected to the anode terminal of primary winding 30 in series with capacitor 56 having low impedance to signal frequencies and high impedance to modulation frequency. The cathode 58 associated with anode 54 is connected to ground and a resistor 60 is connected in shunt with electrodes 54 and 58. As is well known, the voltage resulting at the ungrounded terminal of resistance 60 has a negative direct current component substantially proportional to the magnitude of the impressed carrier. In heretofore known circuits this voltage is filtered and impressed on the automatic gain control bus. According to the invention, however, as shown in Figure 1, a resistor 62 is connected between anode 54 and cathode 44 whereby this negative potential varies the potential of cathode 44 with respect to ground, without at the same time changing the potential between cathode 44 and its associated anode 42. The demodulation action of electrodes 42 and 44 is thus quite unaffected by the rectified potentials supplied from the carrier rectifier 54, 58. Cathode 44 may be effectively connected to ground through a capacitor 64 for modulation and carrier frequency potentials. When a capacitor of sufficient size to perform this task is inserted, it serves in conjunction with resistor 62 to form an RC filter through which modulation potentials are eliminated from the carrier controlled bias impressed on cathode 44. When the tap 47 is made adjustable on the demodulator load 46, 48, as is the case in some volume control circuits, it is essential that the impedance of capacitor 64 at the lowest modulation frequency be sufficiently low to guarantee the desired minimum modulation output level with the volume control set in minimum position.

The total direct current potential with respect to the chassis ground now available at the secondary end of diode load resistor 48 is now equal to the sum of the potentials existing across resistance 60 and across the diode load 46, 48 or double that available when the gain control line is directly connected to the ungrounded terminal of resistance 60. To make this potential available for gain control purposes, a resistor 66 is now connected from the secondary end of resistor 48 to the gain control line 28 and a capacitor 68 shunted from said line 28 to ground to secure the desired gain control time constant and eliminate modulation potentials from the gain control bus.

The operation of the circuit is obvious from the preceding description. An input signal impressed on control grid 14 of amplifier 10 develops across the windings of transformer 32 voltages applied respectively to the tube diodes shown. The demodulation diode is isolated from ground for direct current potentials but grounded for signal, and if so desired, modulation frequency voltages. The demodulator diode functions in its accustomed manner, developing a direct current voltage across the diode load in addition to the signal modulation, and the separate carrier rectifier diode also develops a direct current component across its shunting resistor. These two voltages are now additively combined and impressed on the gain control bus to provide, for control purposes, double the voltage developed in any individual diode circuit. Upon change in the signal level in circuit 24, the available change in bias impressed on control 14 is thus double the change occurring in an individual diode circuit and substantially the same effect is obtained as would be obtained from the insertion of a D. C. amplifier having an effective gain of two. The constancy of signal output level with fluctuation in input level is thus improved.

The circuit arrangement of Figure 1 does not provide what is commonly known as delayed automatic gain control, since gain control is continuously present, whatever the signal input level. In view of the desirability of delayed automatic gain control in many applications where it is preferred that there be no gain control action whatsoever until the signal exceeds a predetermined minimum level, the arrangement of Figure 2 has been devised to meet such requirements. In this figure there is again shown the amplifier 10 whose input circuits may comprise substantially the configuration shown and described in connection with Figure 1 and having its output electrode connected through the transformer 32 with its associated components to the source 20 as in Figure 1. Where reference numerals in this figure duplicate those of Figure 1 it is an indication that the designated part corresponds to the part bearing the same designation in Figure 1. The diode 70 having the anode 72 and cathode 74 is connected across the secondary winding 36 in series with the diode load resistor 76 having an adjustable tap 78. Tap 78 and the secondary end of resistor 76 are grounded for signal frequency currents by capacitors 50 and 52 and it is readily seen that the diode 70 performs the usual function of demodulation of the incoming carrier energy. Signal energy from the primary winding 30 is impressed on the auxiliary diode 80 of the combination amplifier-diode tube 82 by a coupling capacitor 56. The tube 82 is provided with a cathode 84 having sections associated both with the auxiliary diode 80 and the amplifier electrode assembly of the tube 82 which is connected to act as a conventional modulation frequency amplifier. The cathode 84 is connected to ground through resistors 86, which provides operating bias for the amplifier section of the tube 82, and 88, the voltage across which determines the magnitude of delay in the gain control characteristic of the apparatus including this system. The carrier rectifier electrodes 80, 84 are shunted by resistor 60 and combined coupling and filter resistor 62 establishes a direct current connection between cathode 74 and anode 80, signal and modulation frequency potentials being eliminated from cathode 74 by the connection of capacitor 64 therefrom to ground. This circuit develops at the secondary end of resistor 76 a voltage with respect to ground equal to the sum of the direct current voltage component developed across diode load resistor 76, diode shunt resistor 60 and the delay bias resistor 88. As the polarity of the voltage across resistor 88 is in opposition to the polarity developed across the resistors associated with the diodes, the net voltage at the secondary end of resistor 76 is positive for small values of signal input, tending in the negative direction with increases in said signal input, finally becoming actually negative when the sum of the voltages of resistors 60 and 76 exceeds the positive delay bias. The total result in voltage is impressed on the automatic gain control line 28 through the connection of resistor 66 between the line and ungrounded end of resistor 76, and as before, modulation frequency voltages are eliminated from the gain control line by the connection of capacitor 68 in shunt therewith to ground. A diode 90 is connected with its anode 92 electrically attached to line 28 and its cathode 94 connected to ground. Because of the high source impedance presented by combination of resistors across which the control voltages are developed and filter resistor 66, the low resistance of diode 90 in the positive direction, prevents the line 28 from becoming appreciably positive with respect to ground when the net voltage supply total through resistor 66 is positive, but is without effect on the negative voltage excursions of said line 28. The voltage on the gain control line thereby experiences no change with variation of input signal level until the sum of the voltages across resistors 60 and 76 exceeds that existing across delay bias resistor 88, at which time the line 28 is driven negatively to secure the required gain regulation of amplifier 10 and preceding amplifiers connected to the gain control bus. Once the delay voltage has been exceeded, the rate of change of gain control bias voltage is substantially equal to twice the rate of change of signal level at transformer 32, thereby providing improved gain regulation. This is due to the combined utilization of the voltages developed by both the demodulator diode and the carrier rectifier diode in additive relationship.

It is well known that the peak value of the voltage which can be developed across the primary 30 of transformer 32 cannot exceed the voltage delivered by the source 20, and this, in conventional rectifier systems employed in conjunction with gain control circuits, fixes the maximum gain control voltage at the same level. In the arrangements described, the maximum voltage available for gain control purposes is double the former limit, and permits greater reduction in gain for a given signal level at the demodulator. When operating with anode supply voltages of 28 volts, the maximum gain control voltage which can be developed and applied to the gain control bus is 28 volts, and in aircraft receivers placed in operation only a hundred feet or so from the traffic control transmitter at airports, the signal level appearing in the first tuned circuit may well be greater than this, driving the input control grid positive. By employment of the circuit arrangement hereinabove described, the maximum gain control voltage available is increased to 56 volts, which is more than adequate to handle even closer proximity to the transmitting radiator. Apart from this advantage, however, the new configuration provides the same improvement in performance as could be secured by the incorporation of a direct current amplifier having a gain of two, and this without the addition of an expensive tube or an increase in the anode power supply requirements.

For the purpose of simplicity of presentation, the heaters and associated circuits required to actuate the thermionic cathodes shown have been omitted from the drawings, it being understood that any of the well known devices and arrangements for producing the required electronic emission may be employed. It will be obvious that many changes and modifications may be made in the invention without departing from the spirit thereof as expressed in the foregoing discussion and in the appended claims.

I claim:

1. In signal responsive apparatus, a source of signal energy, a first electric discharge device having an input electrode, an output electrode and a cathode, a source of electric energy having a first terminal connected to said cathode, means for impressing signal energy from said signal source on said input electrode, a transformer having primary and secondary windings tuned to resonate substantially at said signal frequency, means connecting said primary winding between a second terminal of said electric energy source and said output electrode, a second electric discharge device having a cathode and an anode, means connecting said anode to one terminal of said secondary winding, resistive means connecting the last named cathode and the other terminal of said secondary winding, a third electric discharge device having a cathode and an anode, means connecting the last named cathode and said first terminal of said electric energy source, a capacitor connecting the anode of said third electric discharge device and said output electrode, a resistor directly connected between the anode of said third electric discharge device and the cathode of said second electric discharge device, a resistor connected between the anode and the cathode of said third electric discharge device, and means for impressing the voltage between the cathode of said third electric discharge device and said other terminal of said secondary winding on said input electrode.

2. In apparatus developing a signal responsive bias potential, a source of signal energy comprising a transformer having primary and secondary windings, a first electric discharge device having an anode and a cathode, means connecting said anode to one terminal of said secondary winding, a first resistor connecting said cathode to the other terminal of said secondary winding, a ground conductor, a second electric discharge device having an anode and a cathode, a capacitor connecting the anode of said second electric discharge device to one terminal of said primary winding, a second resistor connecting the anode and the cathode of said second electric discharge device, a third resistor connected between the cathode of said second electric discharge device and said ground conductor, means for maintaining a flow of direct current through said third resistor, a fourth resistor connected between the anode of said second electric discharge device and the cathode of said first electric discharge device, a bias line, a fifth resistor connected between said other terminal of said secondary winding and said bias line, and a voltage responsive impedance connected between said bias line and said ground conductor.

3. In apparatus developing a signal responsive bias potential, a source of signal energy comprising a transformer having primary and secondary windings, a first electric discharge device having an anode and a cathode, means connecting said anode to one terminal of said secondary winding, a first resistor connecting said cathode to the other terminal of said secondary winding, a ground conductor, a second electric discharge device having an anode and a cathode, a capacitor connecting the anode of said second electric discharge device to one terminal of said primary winding, a second resistor connecting the cathode and the anode of said second electric discharge device, a third resistor connected between the cathode of said second electric discharge device and said ground conductor, means for maintaining a flow of direct current through said third resistor in a direction causing the ungrounded terminal to be positive, a fourth resistor connected between the anode of said second electric discharge device and the cathode of said first electric discharge device, a bias line, a fifth resistor connected between said other terminal of said secondary winding and said bias line, and a third electric discharge device having a cathode connected to said ground conductor and an anode connected to said bias line.

THOMAS G. ARNOLD, Jr.

REFERENCES CITED

The following references are of record in the file of this patent:

UNITED STATES PATENTS

| Number | Name | Date |
|---|---|---|
| 2,073,038 | Wheeler | Mar. 9, 1937 |
| 2,117,664 | Holst | May 17, 1938 |
| 2,144,605 | Beers | Jan. 24, 1939 |
| 2,145,372 | Riddle, Jr. | Jan. 31, 1939 |
| 2,153,780 | Van Loon | Apr. 11, 1939 |
| 2,156,078 | Beggs | Apr. 25, 1939 |
| 2,171,645 | Broos | Sept. 5, 1939 |
| 2,172,476 | Koch | Sept. 12, 1939 |
| 2,207,094 | Getaz | July 9, 1940 |
| 2,208,110 | Andreatta | July 16, 1940 |
| 2,222,759 | Burnside | Nov. 26, 1940 |
| 2,276,488 | Hershey | Mar. 17, 1942 |
| 2,330,902 | McCoy | Oct. 5, 1943 |